United States Patent [19]

Fay et al.

[11] 4,420,700
[45] Dec. 13, 1983

[54] SEMICONDUCTOR CURRENT REGULATOR AND SWITCH

[75] Inventors: Gary V. Fay; Alvin Pshaenich, both of Scottsdale, Ariz.

[73] Assignee: Motorola Inc., Schaumburg, Ill.

[21] Appl. No.: 267,227

[22] Filed: May 26, 1981

[51] Int. Cl.³ .................... H03K 17/00; G05F 1/56
[52] U.S. Cl. .................... 307/571; 307/297; 323/282; 323/351
[58] Field of Search ........... 323/282, 283, 351, 271; 307/297, 571

[56] References Cited

U.S. PATENT DOCUMENTS

| | | | |
|---|---|---|---|
| 3,697,860 | 10/1972 | Baker | 323/271 |
| 3,911,294 | 10/1975 | Davis et al. | 307/571 |
| 4,025,843 | 5/1977 | Parker | 323/289 |
| 4,030,024 | 6/1977 | Chamber et al. | 323/282 |
| 4,189,732 | 2/1980 | Atwater | 323/283 |

Primary Examiner—Stanley D. Miller
Assistant Examiner—B. P. Davis
Attorney, Agent, or Firm—Robert M. Handy

[57] ABSTRACT

A semiconductor current regulating and switching apparatus is described wherein an NMOS enhancement mode power transistor is used in the positive lead to regulate the flow of current from a power source to a load. In order to achieve a low resistance on-state for the NMOS power transistor, the control gate must be biased to a voltage which exceeds the positive voltage of the power source. This bias voltage is generated within the apparatus.

9 Claims, 4 Drawing Figures

— PRIOR ART —

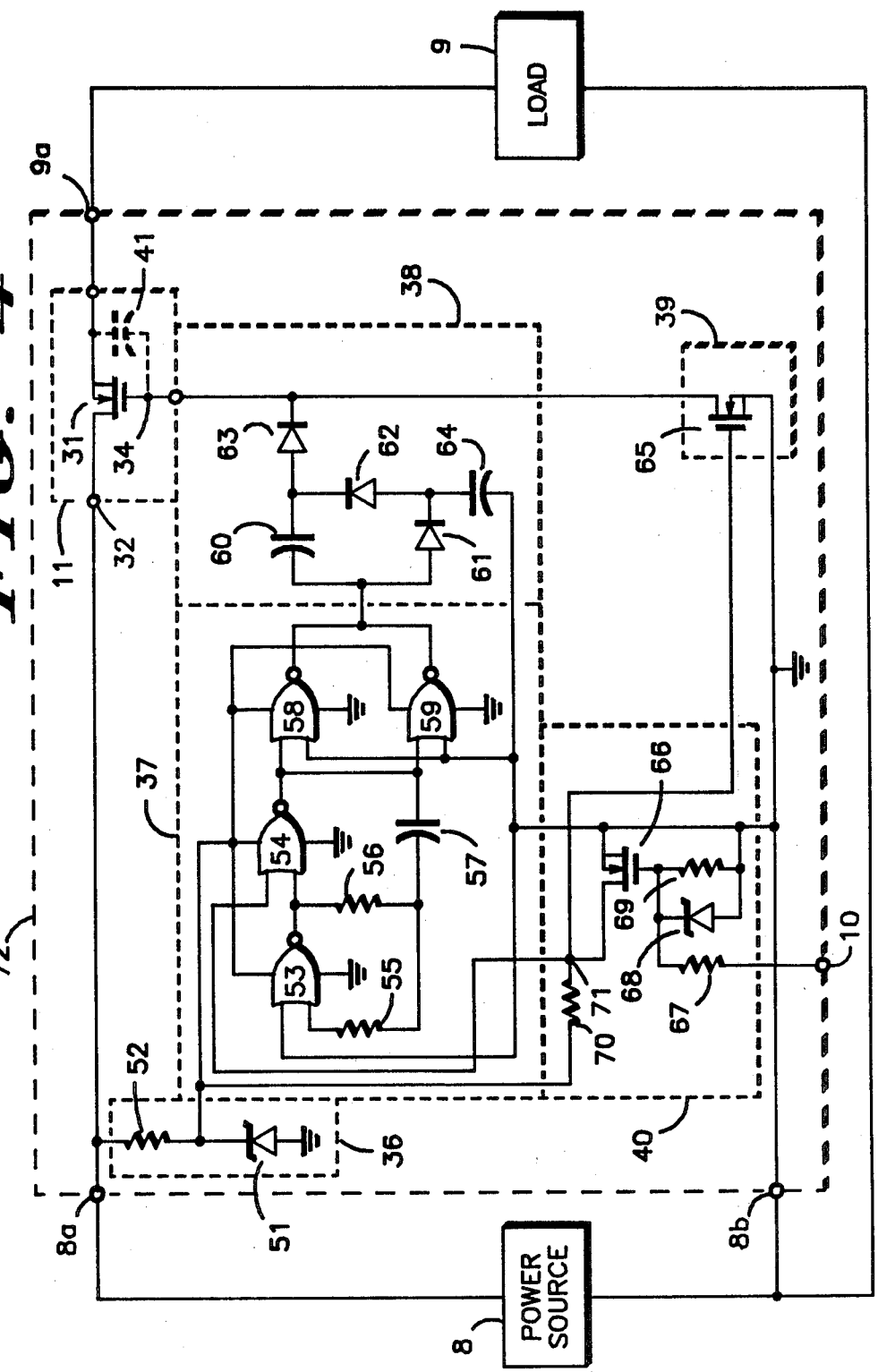

SEMICONDUCTOR CURRENT REGULATOR AND SWITCH

BACKGROUND OF THE INVENTION

1. Field of the Invention

This invention relates, in general, to an improved apparatus for controlling the flow of current from a power source to a load, and, more particularly, to an improved semiconductor apparatus able to be fabricated in integrated form for regulating or interrupting current flow from a power source to a load and having low series on-resistance, low shunt leakage current, and improved breakdown voltage.

2. Description of the Prior Art

Semiconductor devices have long been used as series regulating elements or switches to control the flow of current from a power source to a load. Typically, the two power carrying terminals of the semiconductor device are serially connected in the "hot", or "high side" lead between the power source and load, while the control electrode of the device is provided with a control voltage or current from a driver circuit responsive to an external (control) signal. A common return, or "ground" completes the circuit.

As used herein the words "external signal" denote the external voltage or current to be applied to the control input terminal of the overall circuit or apparatus to effectuate switching or regulation of current flow between the power source and load terminal. The words "control voltage," "control current," or "gate voltage" refer to signals related to the external signal, but internal to the overall circuit or apparatus and used to turn "on" or "off" or to continuously vary the state of individual devices within the circuit or apparatus.

In its most convenient form, the regulating or switching apparatus is arranged so that the driver circuitry draws its power from the same source, that is, the power source supplies current to the driver circuitry as well as to the load. A typical application is in automotive or other transport electrical systems wherein the power source is the battery or alternator, and the semiconductor switch or regulator replaces a mechanical relay, used, for example, to feed the headlamps, landing lights, horn, brakelights, turn signals, alternator field windings, emergency flashers, or other loads.

Series regulators or switches have, in the prior art, been constructed using bipolar power transistors as the current conducting or controlling means, and other bipolar transistors as drivers. Optically coupled devices have also been used. In order to operate from the same power source, particularly where it is desired to integrate the driver and switch functions on a single semiconductor chip or substrate, it is necessary to provide a shunt path across the power supply from which can be derived the bias to switch the current conducting device into an "on", "off", or "intermediate" state in response to the external signal. This shunt, or leakage path, wastes power and, in vehicle applications, can create a significant and undesirable battery drain, even in the off-state.

Metal-oxide semiconductor (MOS) power devices can be used in place of bipolar power devices as the switch or regulator together with other MOS devices for the driver circuitry. Because of the high gate input resistance, the wasted shunt power is much reduced. The simplest arrangement for a negative common line or ground system is to use a p-channel enhancement mode metal-oxide semiconductor (PMOS) power device as the current conducting means series connected between the positive power supply terminal and the load to regulate the current therebetween. An n-channel (NMOS) enhancement mode driver device is connected from the gate of the PMOS device to the common negative (ground) line. The external signal is coupled to the gate of the NMOS driver. When the external signal biases the gate of the NMOS driver positive, above its threshold voltage, it becomes conductive thereby pulling the gate of the PMOS power device to the negative line. This turns on the PMOS power device, permitting conduction between the power source and load. The threshold voltage of a MOS device is that voltage which must be applied between the gate and source terminals to obtain significant current flow between the source-drain terminals of the device. Pull-down resistors are provided between gate and source terminals of the devices to hold the circuit in the off-state in the absence of the external signal.

This approach is simple, has a low component count, and reduces the shunt leakage. However, it requires a relatively large power device to achieve acceptably low on-resistance because of the poor carrier mobility in PMOS devices. This large device area substantially increases the overall cost of the apparatus. An NMOS power device of higher carrier mobility cannot be directly substituted because the drive circuit would not provide the correct polarity of signal to the control gate of the NMOS power device. Thus, a need continues to exist for an improved high side line switch or regulator apparatus for controlling current flow from a power source to a load, which draws power from the same source, which can be readily integrated, and which has low on-resistance and shunt leakage. High breakdown voltage is also desirable.

Accordingly, it is an object of this invention to provide an improved apparatus responsive to an external signal for regulating the flow of current from a power source to a load.

It is further an object of this invention to provide an improved high side line switching apparatus for regulating the flow of current utilizing MOS power transistors.

It is an additional object of this invention to provide a switching apparatus for regulating the flow of current which permits the use of NMOS power transistors in the positive line of a negative return system.

It is a further object of this invention to provide an MOS apparatus for regulating the flow of current having reduced series on-resistance.

It is an additional object of this invention to provide an improved apparatus for regulating the flow of current from a positive power source to a load using an NMOS power device serially connected in the positive lead and a driver circuit, fed from the same source, to control the power device.

It is a still further object of this invention to provided an improved means for holding a current regulating device in an off-state in the absence of an external signal.

SUMMARY OF THE INVENTION

These and other objects and advantages are achieved in accordance with the present invention wherein, according to a first aspect of the invention, there is provided an apparatus responsive to an external signal for regulating the flow of current from a power source of a predetermined voltage to a load, having a current conducting means for regulating current flow between a first power terminal adapted to be coupled to the power source and a second power terminal adapted to be coupled to the load, and having a third control terminal for turning on the current only in response to a control voltage which exceeds the predetermined voltage, and a driver means adapted to be coupled to the power source and the control terminal for stepping-up the predetermined voltage in response to the external signal to form the control voltage, so that during the on-state of the regulator apparatus the control voltage exceeds the predetermined voltage.

According to a further aspect of the invention wherein the predetermined voltage is positive, the current conducting means is provided by an NMOS enhancement mode transistor, and the driver means comprises: a stabilizer means coupled to the first power terminal and having a limited voltage output; an oscillator means responsive to the external signal, coupled to the stabilized voltage output of the stabilizer means, and having an output for oscillatory signals; and, a converter means coupled to the oscillator output and to the control terminal of the NMOS transistor for converting the oscillator signals to unidirectional pulses for accumulation in storage capacitors to product on the control terminal a control voltage larger than the predetermined power source voltage.

According to a yet further aspect of the invention, a clamp means responsive to the external signal and coupled to the control terminal is provided to reduce and hold the control voltage, in the absence of the external signal, below a threshold voltage for substantial current flow through the current conducting means.

According to a still further aspect of the invention, the intrinsic gate terminal capacitance of the NMOS power transistor forms a portion of the storage capacitance used to accumulate the unidirectional pulses derived in the converter means, and is coupled to the converter means by a unidirectional element. Additionally, a buffer is optionally provided between the input for the external signal controlling the apparatus and the oscillator means to more easily permit the external signal to initiate or inhibit oscillation in the oscillator means according to whether the current conductive means is desired to be turned on or off.

The above and other objects, features, and advantages of the present invention will be more clearly understood from the following detailed description taken in conjunction with the accompanying drawings.

BRIEF DESCRIPTION OF THE DRAWINGS

FIG. 4 is a detailed schematic diagram of the apparatus shown in FIG. 3.

DETAILED DESCRIPTION OF THE PREFERRED EMBODIMENT

Figure 1:
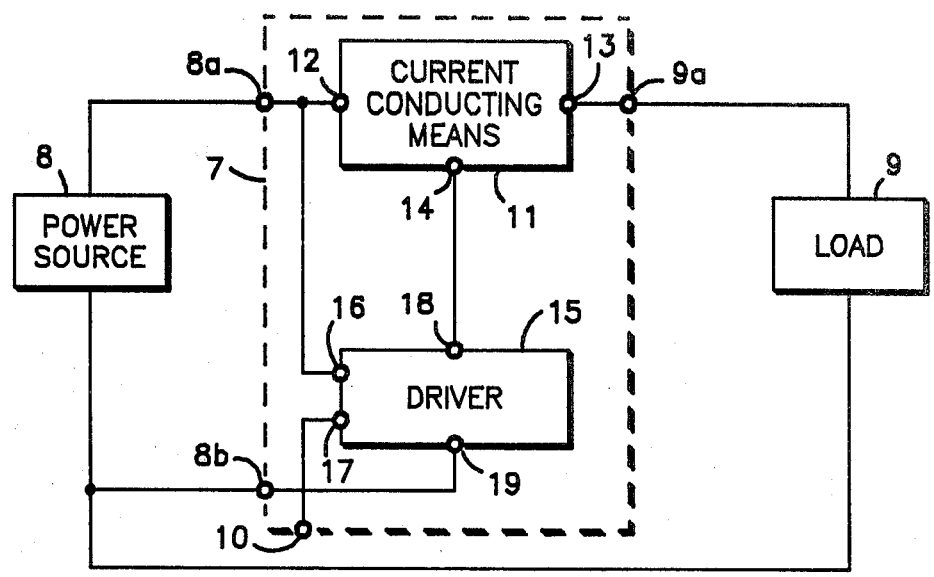
FIG. 1 is a generalized block diagram of a series regulator or switching apparatus.

Referring to FIG. 1, current regulating apparatus 7, comprising current conducting means 11 and driver means 15, control, current flow from power source 8 to load 9 in response to an external signal applied to control input terminal 10. Current conducting means 11 has power terminals 12 and 13 and control terminal 14. Driver means 15 has terminal 17 for receiving an external signal from control input terminal 10, power input terminal 16 connected to power terminal 12 and power source input terminal 8a, control signal output terminal 18 coupled to control terminal 14 of current conducting means 11, and terminal 19 coupled to power source return terminal 8b. Power terminal 13 of current conducting means 11 is connected to load input terminal 9a. Power source 8 and load 9 may be disconnected from terminals 8a-b and 9a respectively and are not a part of apparatus 7.

Figure 2:
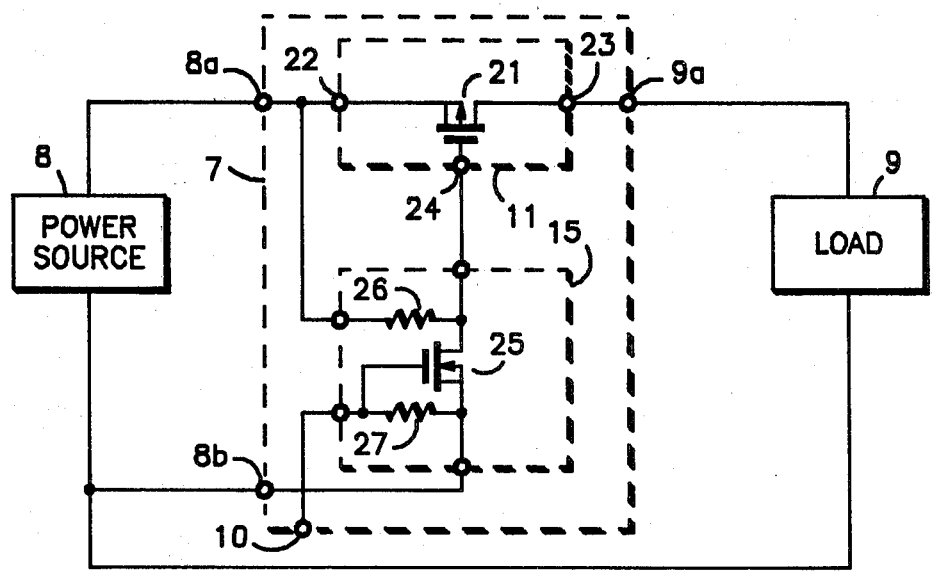
FIG. 2 is a prior art example of a series regulating or switching apparatus using a PMOS power transistor as the series regulating element and a NMOS transistor as the driver.

FIG. 2 represents an example of an implementation of regulator function 7 according to the prior art. PMOS enhancement mode power transistor 21 serves as current conducting means 11. PMOS power device 21 has source 22, drain 23, and gate 24. Driver means 15 comprises NMOS enhancement mode driving transistor 25, and resistors 26 and 27. This prior art circuit of FIG. 2 is relatively simple and has a low component count, due to the use of p-channel power device 21 and n-channel driver device 25. This combination provides the correct polarities for switching device 21 into the on-state. The maximum voltage which can be applied from power source 8 is ordinarily limited by the gate-source breakdown voltage of PMOS device 21. This is dependent on the thickness of the gate oxide and is typically in the range of 30-100 volts. However, a resistive voltage divider may be connected to the gate. This permits a larger power source voltage before breakdown of the PMOS device, but at the expense of an increase in the semiconductor chip area occupied by the circuit. The chip area will also be large because of the low hole carrier mobility of the PMOS device.

It is highly desirable to replace PMOS device 21 with an NMOS power device because of the much higher electron carrier mobility of n-channel devices. The source-drain resistance of a MOS device is, to a first approximation, inversely proportional to the carrier mobility in the channel. Thus, higher mobility provides lower on-state resistance for a given device area, or conversely, permits the same on-state resistance to be achieved with a much smaller device area. The difference in electron and hole mobility can be substantial. In silicon, for example, electron drift mobilities are typically 2.6–2.8 times larger than hole drift mobilities. Thus, for the same channel resistance, an NMOS device will occupy less than half the area of a comparable PMOS device. An NMOS power device cannot be simply substituted for the PMOS power device in the positive lead of the circuit of FIG. 2 because driver 15 does not supply the correct polarity of gate signal to turn on the NMOS device.

Figure 3:
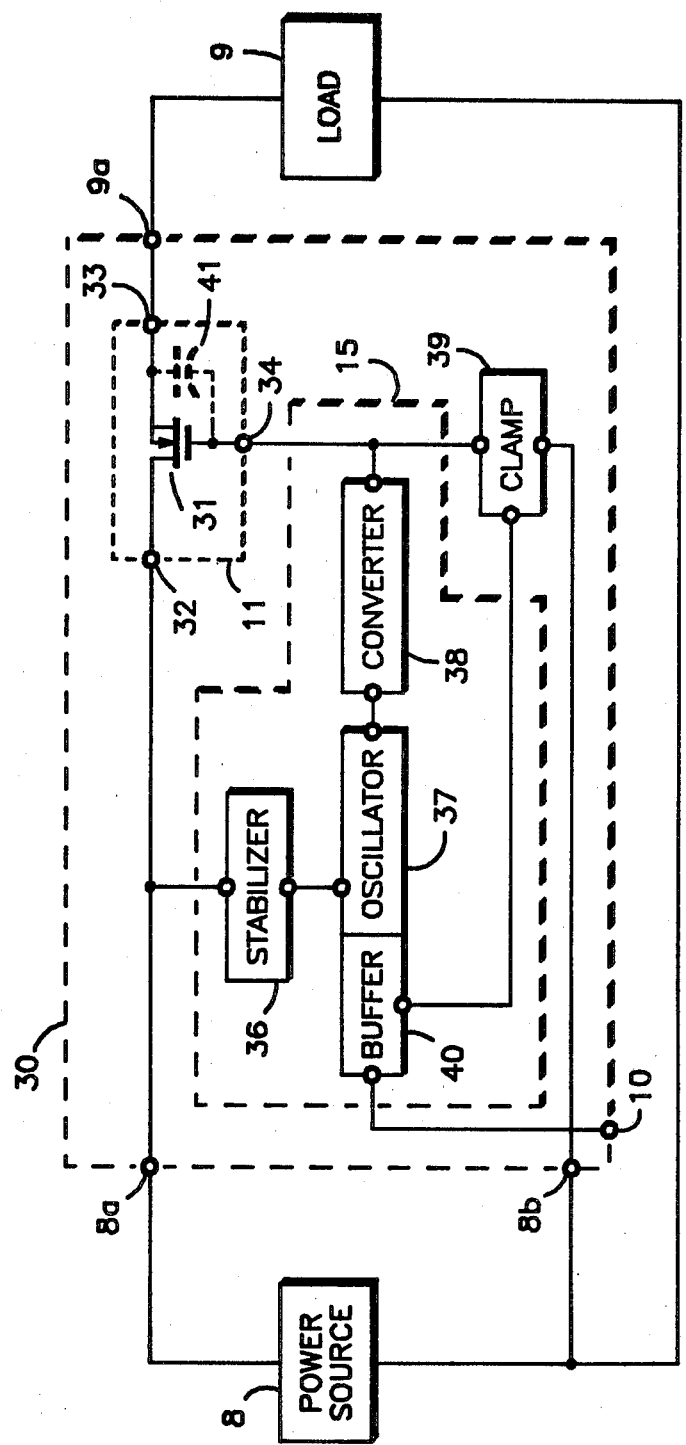
FIG. 3 is a block diagram of the implementation of the generalized current regulating or switching apparatus of FIG. 1 according to the present invention.

These and other problems are overcome by use of regulator apparatus 30 of the present invention illustrated in block diagram form in FIG. 3, wherein current conducting means 11 comprises NMOS enhancement mode power transistor 31 having power terminals 32 (drain) and 33 (source) and control terminal 34 (gate). "Enhancement" mode refers to devices or means which are electrically "normally off," that is, there is no significant conduction between the main electrodes or terminals of the device or means when no current or voltage is applied to the control electrode or terminal of the device or means. Conversely, when a current or voltage of the correct polarity to turn on the device is applied to the control electrode or terminal, conduction between the main electrodes or terminals occurs. This current or voltage on the control electrode or terminal is said to "enhance" conduction. For an MOS transistor, the main terminals are the source-drain electrodes and the control terminal is the gate electrode.

Transistor 31 is serially connected between power source input terminal 8a and load input terminal 9a. Terminal 8a is adapted to receive the positive line of power source 8, and terminal 9a the "hot" lead of load 9. During operation, it is typically desired that in response to an external signal applied to control input terminal 10 of regulating apparatus 30, that device 31 turn on so that the on-state resistance of device 31 is small and the associated voltage drop accompanying the flow of current from power source input terminal 8a to load input terminal 9a through device 31 is a fraction of a volt. When this occurs, load 9 receives substantially the full voltage of power source 8. In order to achieve low on-state series resistance and hence low voltage drop across terminals 32–33 of power device 31, control terminal 34 of device 31 must be biased positively with respect to source terminal 33 to a voltage larger than that which exists on drain 32 and input terminal 8a. Thus, the control voltage required at terminal 34 to turn on device 31 must exceed the voltage being delivered to input terminal 8a by power supply 8, that is, be more positive than the most positive value of the power supply voltage.

The necessary control voltage on terminal 34 is provided by driver 15 which comprises stabilizer 36, oscillator 37, converter 38, and buffer 40. Stabilizer 36 is adapted to derive power from power source 8 through input terminal 8a and provides to oscillator 37 and buffer 40 a regulated or limited voltage which is substantially independent of the magnitude of the voltage of power source 8 whenever the voltage of power source 8 exceeds a predetermined limit value established by the stabilizer. This serves to protect oscillator 37, buffer 40, converter 38 and other circuit elements as well as control gate 34 of device 31 from high voltage transients which may occur in power source 8. While use of stabilizer 36 is desirable, it is not essential, particularly in view of the improved breakdown characteristics provided by use of NMOS device 31 for current conducting means 11.

Oscillator 37 derives power from stabilizer 36 and is controlled in its operation by an external signal applied to control input terminal 10. Buffer 40 is conveniently provided as a level-shifter between the external signal appearing at control input terminal 10 and oscillator 37. Oscillator 37 may be of any convenient type whose operation can be controlled by an external signal. For simplicity, the system of the present invention is illustrated for the situation in which a positive voltage applied to terminal 10 causes oscillator 37 to commence oscillation and the absence of a positive voltage applied to terminal 10 causes oscillator 37 to cease oscillation. It will be recognized by those of skill in the art that other combinations and polarities are possible to achieve this same objective of starting and stopping oscillator 37. For example, buffer 40 may contain one or more inverter or amplifier stages so that any first predetermined continuous valve, pulse, or pulse train of external signal applied to terminal 10 may cause oscillator 37 to commence oscillations, and any second continuous level, pulse, or pulse train of external signal applied to terminal 10 may cause oscillator 37 to cease oscillations. Either ac or dc may be used. In the case of the pulse train, the buffer also functions as a decoder and/or detector. As used herein, "buffer" is intended to encompass any means for translating, inverting, level shifting, detecting, and/or decoding an external input signal of any form whatever into a form suitable for starting or stopping oscillator 37 and disengaging or engaging clamp means 39 according to whether current is to be permitted to flow through means 11 or not. Of course, it will be understood that buffer 40 can be omitted if the signal appearing at input 10 is compatible to be directly coupled to oscillator 37.

Converter 38 receives oscillations from oscillator 37, converts them to unidirectional pulses, and uses, for example, a conventional diode capacitor voltage "doubling" network to accumulate these unidirectional pulses and provide a voltage to control gate 34 which exceeds the value of the power source voltage appearing at terminal 8a, thus enabling current flow between power source input terminal 8a and load input terminal 9a. Advantage is taken of intrinsic parasitic capacitance 41 of gate electrode 34 of NMOS device 31 in cooperation with the pulse accumulation capacity of converter 38 so as to minimize the circuit area occupied by converter 38 in integrated form. While a voltage "doubling" network is convenient, other voltage step-up means can be used. The voltage need not be "doubled" per se. Any value exceeding the voltage of power source 8 and of an amount sufficient to exceed the threshold voltage of device 31 and drive it to the desired variable or low resistance state is sufficient. This value may be readily determined by methods well known in the art. The low resistance state is appropriate when the apparatus functions simply as an on-off switch, and the variable resistance state when it functions as a regulator.

Clamp means 39 is provided between power device control terminal 34 and power source return terminal 8b and is responsive, conveniently through buffer 40, to the external signal applied to control input terminal 10. In the absence of an external signal applied to terminal 10, clamp means 39 is in the on-stage and has a comparatively low resistance. Thus, parasitic capacitance 41 is rapidly discharged and gate 34 is held substantially at the voltage of the negative side (8b) of power source 8, that is, below the threshold voltage for conduction in device 31. This insures that regulating NMOS device 31 turns off rapidly and remains in the off-stage in the absence of an external (turn-on) signal applied to terminal 10, thus disabling current flow between power source input terminal 8a and load input terminal 9a.

FIG. 4 is a detailed schematic diagram of a preferred implementation of the current regulating apparatus shown in block form in FIG. 3. The specific circuit of FIG. 4 is particularly suited for use in, for example, marine, vehicle, or aircraft environments having a dc power source of approximately 13.5 volts and an external (turn-on) signal of approximately 5 volts. Current conducting means 11 is provided by NMOS enhancement mode transistor 31 having parasitic gate-source capacitance 41 and gate terminal 34. Stabilizer means 36 is conveniently provided by dropping resistor 52 and zener diode 51. Zener diode 51 is typically chosen to have a zener voltage of approximately fifteen volts which prevents high voltage transients which may appear from power source 8 from reaching other parts of the driver circuitry. If high voltage transients are not a problem, zener 51 and resistor 52 may be omitted.

Oscillator means 37 is prvided by the combination of integrated MOS NOR gates 53 and 54, resistors 55 and 56, and feedback capacitor 57. Oscillator means 37 desirably, but not essentially, contains MOS amplifying NOR gates 58 and 59. The logic output of gate 54 is coupled to a first input terminal of parallel amplifying gates 58–59 and through capacitor 57 to a first terminal of resistors 55 and 56. The second terminal of resistor 56 is connected to a first logic input of gate 54 and the logic output of gate 53. The second terminal of resistor 55 is connected to a first logic input of gate 53. The second logic input of gate 53 is connected to power source return terminal 8b which functions as the "ground" point of the driver circuit. The second logic input terminal of gate 54 is connected to node 71 at the junction of buffer load resistor 70 and the drain terminal of input inverting transistor 66. The second input of parallel amplifying gates 58–59 is grounded. The output of parallel amplifying gates 58–59 comprises the oscillator output and is coupled to capacitor 60 and diode 61 of converter means 38.

Converter means 38 has diode means 61, 62, and 63, and capacitors 60 and 64 which together with parasitic capacitor 41 provide the voltage doubling action to produce the control voltage to be applied to gate 34 of transistor 31. This control voltage exceeds the predetermined voltage of power source 8 appearing at terminal 8a.

Clamp means 39 is implemented in this embodiment by means of n-channel enhancement mode transistor 65, whose gate electrode is coupled to control input terminal 10 through transistor 66 and resistor 67, and to power source input terminal 8a through resistor 70 of buffer 40 and resistor 52 of stabilizer 36. The drain electrode of device 65 is coupled to gate terminal 34, and the source electrode of device 65 is connected to power source return terminal 8b.

Buffer 40 comprises input series protective resistance 67, input shunt zener diode 68 and shunt resistance 69, together with inverting transistor 66 and load resistor 70. Apparatus 72 (contained within the dashed outline of FIG. 4) for regulating the flow of current between power source terminal 8a and load terminal 9a can be readily integrated provided that capacitor values less than approximately fifty picofarads and resistor values in the range 1000–50,000 ohms are utilized. For convenience, resistors 55 and 56 and capacitor 57 are chosen to produce an oscillation frequency in the range 100–1,000 kilohertz.

Regulating apparatus 72 is adapted to be connected to power source 8 of approximately 13.5 volts and to load 9. In the absence of an external signal applied to control input terminal 10, transistor 31 remains in the off-state due to the action of enhancement mode transistor 65. When a +5 volt external signal is applied to control input terminal 10, buffer transistor 66 is turned on and node 71 pulled to substantially ground potential. This causes clamp device 65 to turn off and also initiates oscillation in oscillator 37. The output of oscillator 37 is amplified by one or more gates 58–59 and rectified by diodes 61–62 to charge capacitors 60 and 64, and further, through diode 63, to charge parasitic capacitor 41 of power device 31. In integrated form, gates 58 and 59 can be lumped together or combined with gates 53–54. Diodes 61–62 and capacitors 60 and 64 form a conventional voltage doubler. Diode means 63 couples the output of the diode-capacitor voltage doubler of converter means 38 to control gate 34 of device 31 to charge parasitic capacitor 41. Diode means 63 further prevents control gate parasitic capacitance 41 from discharging through storage capacitors 60 and 64, diode 61, and associated circuitry. Diode means 61–63 can be formed from diodes, diode coupled transistors, or other unidirectional elements. The circuit of FIG. 4 provides to control gate 34 of power device 31 a turn-on voltage which exceeds the predetermined voltage of power source 8 appearing at power source input terminal 8a, in response to the presence of an external (turn-on) signal applied to terminal 10.

The circuits of FIGS. 3 and 4 contain substantially more components than the prior art circuit of FIG. 2. However, in an integrated structure, very little chip surface area is occupied by the components necessary to implement the driver circuit of FIGS. 3 and 4. The area occupied by the driver circuit is smaller than the area saved by switching from a PMOS to a NMOS power device by virtue of the increased n-channel carrier mobility. Thus, the overall chip area occupied by the components contained within outline 30 of FIG. 3 or 72 of FIG. 4 can be smaller, for the same performance, than those within outline 7 of FIG. 2. Thus, a cost savings is obtained over the prior art. Alternatively, for the same total chip area, the regulating performance may be improved, for example, by reducing the on-state resistance.

The use of a NMOS power device in the positive (hot) lead for controlling the flow of current from power source terminal 8a to load terminal 9a gives increased maximum operating voltage over what would be obtained with a PMOS transistor. This comes about because with the NMOS device, the drain is coupled to power source input terminal 8a, while the source is connected to load output terminal 9a. With the PMOS device the connections are reversed, as can be seen in FIG. 2 of the prior art. Thus, in the prior art device of FIG. 2, the maximum input voltage is substantially limited by the gate-source breakdown voltage of power device 21. With the present invention using an NMOS device, the maximum input voltage from the power source is substantially limited by the gate-drain breakdown voltage of power device 31. Since it is common in power MOS devices that the gate-drain breakdown voltage is higher than the gate-source breakdown voltage, the maximum possible safe operating voltage of the circuit is thereby increased. This is a significant advantage.

While a particular embodiment of the invention has been shown and described, it will be understood that the invention is not limited thereto since many modifications may be made therein and will become apparent to those skilled in the art. For example, where a positive ground system is required an equivalent apparatus can be constructed using a PMOS device in the negative lead, wherein the driver means provides a negative voltage of magnitude larger than the power source voltage. The same principles apply.

We claim:

1. An apparatus responsive to an external signal for regulating the flow of current from a power source of predetermined voltage to a load, comprising:

enhancement mode type current conducting means for regulating current flow between a first power terminal adapted to be coupled to said power source and a second power terminal adapted to be coupled to said load, and having a control means for enabling said current flow only in response to a control voltage larger than said predetermined voltage;

clamp means responsive to said external signal and coupled to said control means for disabling said current flow only in response to a turn-off portion of said external signal;

driver means coupled to said power source and said control means for generating said control voltage from said predetermined voltage in response only to a turn-on portion of said external signal, wherein said driver means comprise;

stabilizer means coupled to said first power terminal and having a limited voltage output;

oscillator means responsive to said external signal, coupled to said stabilizer voltage output and having an output for oscillatory signals; and converter means coupled to said output for oscillatory signals and to said control means for converting said oscillatory signals to unidirectional pulses for accumulation in storage capacitance to produce said control voltage on said control means.

2. The apparatus of claim 1 wherein said control means comprises a gate electrode of predetermined gate capacity and wherein said storage capacitance for accumulation of unidirectional pulses comprises said gate capacity.

3. The apparatus of claim 2 wherein said oscillator means further comprises an input buffer means adapted to be coupled between said oscillator means and said external signal to provide a signal compatible to said oscillator means to initiate oscillation in response to said external signal.

4. The apparatus of claim 3 wherein said converter means comprises diode means for coupling said converter means to said gate electrode.

5. The apparatus of claim 4 wherein said predetermined voltage is positive and said current conducting means comprises an NMOS transistor.

6. The apparatus of claim 5 wherein said oscillator means comprises a first NOR gate having a logic output coupled to said output for oscillatory signals and to a first terminal of a capacitor, said capacitor having a second terminal coupled to a first terminal of a first and second resistor, said first resistor having a second terminal connected to a first logic input terminal of said first NOR gate and a logic output terminal of a second NOR gate, and said second resistor having a second terminal coupled to a first logic input terminal of said second NOR gate, said second NOR gate having a second logic input terminal coupled to a power source return terminal, said first NOR gate having a second logic input terminal coupled to a drain terminal of an inverting buffer input transistor and a first terminal of a third resistor, said third resistor having a second terminal coupled to a power source input terminal, said input transistor having a source terminal coupled to said power source return terminal and a gate electrode coupled to an external signal input for controlling said oscillator, and wherein said first and second NOR gates have power supply terminals coupled to said power source input and return terminals.

7. A switching apparatus, responsive to an external signal applied to a control input terminal, for permitting electrical current flow from a power source input terminal to a load input terminal, in response to an "on" portion of said external signal and inhibiting electrical current flow in response to an "off" portion of said external signal, and having a common terminal, comprising:

an enhancement mode MOS transistor having drain, source and gate electrodes, said drain and source electrodes being serially connected between said power source input terminal and said load input terminal, and said gate electrode being adapted for regulating said current flow in response to a control voltage applied to said gate electrode;

driver means coupled to said power source input terminal, said gate electrode, said common terminal, and said control input terminal for generating said control voltage on said gate electrode in response to said external signal applied to said control input terminal, and wherein said control voltage, in response to said "on" portion exceeds in magnitude a voltage appearing on said power source input terminal;

clamp means coupled to said gate electrode, said control input terminal, and said common terminal for discharging and holding in an off-state said gate electrode in response to said "off" portion; and buffer means coupled to said driver means, said clamp means, said power source input terminal, and said control input terminal, for receiving and interpreting said external signal to differentiate said "on" portions and "off" portions so as to energize said driver means and clamp means alternatively during said "on" portions and "off" portions respectively.

8. The apparatus of claim 7 further comprising a stabilizer means coupled to said power source input terminal, said common terminal, said buffer means, said clamp means, and said driver means for protecting said gate electrode, said buffer, said driver, and said clamp means from voltage transients exceeding a predetermined level appearing on said power source input terminal.

9. The apparatus of claim 8 wherein said voltage appearing on said power source input terminal is positive, and said MOS transistor is an NMOS transistor.

* * * * *